(12) United States Patent
Thridandam et al.

(10) Patent No.: US 7,875,312 B2
(45) Date of Patent: Jan. 25, 2011

(54) PROCESS FOR PRODUCING SILICON OXIDE FILMS FOR ORGANOAMINOSILANE PRECURSORS

(75) Inventors: Hareesh Thridandam, Vista, CA (US); Manchao Xiao, San Diego, CA (US); Xinjian Lei, Vista, CA (US); Thomas Richard Gaffney, Carlsbad, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 632 days.

(21) Appl. No.: 11/439,554

(22) Filed: May 23, 2006

(65) Prior Publication Data
US 2007/0275166 A1 Nov. 29, 2007

(51) Int. Cl.
C23C 16/00 (2006.01)
(52) U.S. Cl. .................................................. 427/248.1
(58) Field of Classification Search ........................ None
See application file for complete search history.

(56) References Cited

U.S. PATENT DOCUMENTS

| | | | |
|---|---|---|---|
| 4,200,666 A | 4/1980 | Reinberg | |
| 5,008,422 A * | 4/1991 | Blum et al. | 556/412 |
| 5,234,869 A | 8/1993 | Mikata et al. | |
| 5,250,473 A | 10/1993 | Smits | |
| 5,382,550 A | 1/1995 | Iyer | |
| 5,458,689 A | 10/1995 | Saito | |
| 5,622,784 A * | 4/1997 | Okaue et al. | 428/447 |
| 5,656,076 A | 8/1997 | Kikkawa | |
| 5,772,757 A | 6/1998 | Saito | |
| 5,837,056 A | 11/1998 | Kikkawa | |
| 5,874,368 A | 2/1999 | Laxman et al. | |
| 6,153,261 A | 11/2000 | Xia et al. | |
| 6,391,803 B1 | 5/2002 | Kim et al. | |
| 6,486,015 B1 * | 11/2002 | Chaudhary et al. | 438/229 |
| 6,500,772 B2 | 12/2002 | Chakravarti et al. | |
| 6,630,413 B2 | 10/2003 | Todd | |
| 6,974,780 B2 | 12/2005 | Schuegraf | |
| 7,098,150 B2 | 8/2006 | Misra et al. | |
| 7,482,286 B2 | 1/2009 | Misra et al. | |
| 2002/0175393 A1 * | 11/2002 | Baum et al. | 257/506 |
| 2005/0163927 A1 | 7/2005 | McSwiney et al. | |
| 2006/0051975 A1 | 3/2006 | Misra et al. | |
| 2006/0099831 A1 | 5/2006 | Borovik et al. | |
| 2006/0258173 A1 | 11/2006 | Xiao et al. | |
| 2009/0069588 A1 | 3/2009 | Xiao et al. | |
| 2009/0075490 A1 | 3/2009 | Dussarrat | |

FOREIGN PATENT DOCUMENTS

| | | |
|---|---|---|
| EP | 0 481 706 A1 | 4/1992 |
| EP | 1149934 | 8/2005 |
| GB | 1123252 | 8/1968 |
| JP | 06-132276 | 5/1994 |
| JP | 6-132276 A | 5/1994 |
| JP | 06-132276 A | 5/1994 |
| JP | 06-132284 | 5/1994 |
| JP | 06-132284 A | 5/1994 |
| JP | 07235535 | 9/1995 |
| JP | 00-195801 | 7/2000 |
| JP | 2001-156063 A1 | 6/2001 |
| JP | 2005-26244 A | 1/2005 |
| KR | 1020060018641 | 2/2006 |
| WO | 200265508 | 8/2002 |
| WO | 2004/010467 A2 | 1/2004 |
| WO | 2004/017383 A2 | 2/2004 |
| WO | 2004030071 | 4/2004 |
| WO | 2005/080628 A2 | 9/2005 |
| WO | 2005093126 | 10/2005 |
| WO | 2006036538 | 4/2006 |
| WO | 2006097525 | 9/2006 |

OTHER PUBLICATIONS

C. Glidewell, et al, Electron Diffraction Determination of the Molecular Structure of Tetrasilylhydrazine, Journal of the Chemical Society, 1970, 318-320.
H. Beck, et al, Radical Ions. 36. Structural Changes Accompanying the One-Electron Oxidation of Hydrazine and Its Silyl Derivatives1-3, Journal of the American Chemical Society, 1980, 4421-4428.
B.J. Aylett, The Silyl Group as an Electron Acceptor, J. Inorg. Nucl. Chem., 1956, 325-329.

(Continued)

*Primary Examiner*—Timothy H Meeks
*Assistant Examiner*—Joseph Miller, Jr.
(74) *Attorney, Agent, or Firm*—Rosaleen P. Morris-Oskanian

(57) ABSTRACT

The present invention is directed to a method for depositing a silicon oxide layer on a substrate by CVD. The reaction of an organoaminosilane precursor where the alkyl group has at least two carbon atoms in the presence of an oxidizing agent allows for the formation of a silicon oxide film. The organoaminosilanes are represented by the formulas:

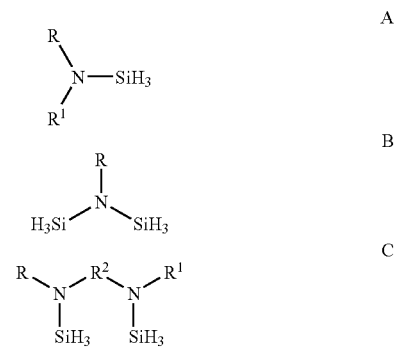

The use of diisopropylaminosilane is the preferred precursor for the formation of the silicon oxide film.

24 Claims, No Drawings

OTHER PUBLICATIONS

N. Bingo, et al, Correlations Among X-H Bond Lengths, X-H Stretching Frequencies, and Bond Order Matrix Elements P HX: where X=C, N, and Si, J. Sci. Hiroshima Univ., 1976, 317-326.

B.J. Aylett, Vibrational spectra and structure of tetrasilylhydrazine and tetrasilylhydrazine-d, Spectrochimica Acta, 1960, 747-758.

C. Glidewell, et al, Some Preparative and Spectroscopic Studies of Silylamines, Journal of the Chemical Society a Inorg. Phys. Theor., 1970, 279-286.

A. V. Golubinszkij, et al, Molecular-structure Examination of Some Organic Silicon Compounds by Electron Diffraction, Kémiai Közlemények, 46, 1976, 473-480.

B.J. Aylett, et al, N-Silyl Derivatives of Cyclic Secondary Amines, J. Chem. Soc, 1967, 1918-1921.

B.J. Aylett, et al, Silicon-Nitrogen Compounds, Part VIII. Base-Promoted Disproportionation of N-Methly- and N-Phenyl-Disilazane, J. Chem. Soc., 1969, 1788-1792.

D. Anderson, et al, Isopropyldisilylamine and Disilyl-t-butylamine: Preparation, Spectroscopic Properties, and Molecular Structure in the Gas Phase, determined by Electron Diffraction, J. Chem. Soc., 1989, 779-783.

Gary E. Mcguire, Semiconductor Materials and Process Technology Handbook, Noyes Publications, NJ, 1988, pp. 239-301.

Stanley Wolf, Silicon Processing for the VLSI Era, Lattice Press, CA 1990, pp. 327-330.

Arthur K. Hochberg, et al, Diethylsilane as a Source for the Deposition . . . , Mat. Res. Soc, Symp. Proc., vol. 204, 1991, pp. 509-513.

Tetsuji Sorita, et al, Mass Spectrometric and Kinetic Study of Low-Pressure . . . , J. Elec. Soc., vol. 141, No. 12, 1994, pp. 3506-3511.

B.J. Aylett, et al, The Preparation and Properties of Dimethylamino- and . . . , J. Chem. Soc. (A), 1967, pp. 652-655.

Sei Sujishi, et al, Effect of Replacement of Carbon by Silicon in Trimethylamine . . . , J. Am. Chem. Soc., vol. 78, 1956, pp. 4631-4636.

Kenneth Hedberg, The Molecular Structure of Trisilylamine (SiH3) 3N1, 2, J. Am. Chem. Soc., 1955, vol. 77, pp. 6491-6492.

J.M. Grow, et al, Growth Kinetics and Characterization of Low Pressure . . . , Mat. Letters vol. 23, 1995, pp. 187-193.

B.A. Scott, et al, Preparation of Silicon Nitride with Good Interface . . . , Chemtronics, 1989, vol. 4, pp. 230-233.

B.J. Aylett, et al, Silicon-Nitride Compounds. Part V. Diphenylamino-derivatives of Silane, J. Chem. Soc., 1989, 636-639.

Norbert W. Mizel, Simple Silylhydrazines as Models for Si-N.beta.-donor Interactions in SiNN Units, Chemistry-A European Journal, 1998, 692-698.

Hubert Schmidbuar, et al, Differences in Reactivity of 1,4-Disilabutane and N-Tetrasilane Towards Secondary Amines, Zeitschrift Fur Naturforschung B: Chemical Sciences, 1990, 1679-1683.

* cited by examiner

PROCESS FOR PRODUCING SILICON OXIDE FILMS FOR ORGANOAMINOSILANE PRECURSORS

BACKGROUND OF THE INVENTION

In the fabrication of semiconductor devices, a thin passive layer of a chemically inert dielectric material such as silicon oxide is essential. Thin layers of silicon oxide function as insulators between polysilicon and metal layers, diffusion masks, oxidation barriers, trench isolation, intermetallic dielectric material with high dielectric breakdown voltages and passivation layers.

The following articles and patents are cited as representative of the art with respect to the synthesis of deposition processes employed in the electronics industry for producing silicon oxide films.

U.S. Pat. No. 5,250,473 discloses a method of providing a silicon dioxide layer having a substantially uniform thickness at an improved deposition rate on a substrate by means of low pressure chemical vapor deposition (LPCVD). The reactants generally comprise mixture of an oxidizing agent and a chlorosilane, wherein the chlorosilane is a monochlorosilane of the formula $R_1R_2SiHCl$ and where $R_1$ and $R_2$ represent an alkyl group. The silicon dioxide layer may be deposited on various substrates such as aluminum.

U.S. Pat. No. 5,382,550 discloses a CVD process for depositing $SiO_2$ film on a semiconductor substrate. An organosilicon compound, e.g., tetraethylorthosilicate (TEOS) or ditertiarybutylsilane is used as precursor.

U.S. Pat. No. 6,391,803 discloses a process for producing silicon nitride and silicon oxide films using ALD and employing compounds of the formula: $Si[N(CH_3)_2]_4$, $SiH[N(CH_3)_2]_3$, $SiH_2[N(CH_3)_2]_2$ or $SiH_3[N(CH_3)_2]$. Trisdimethylaminosilane (TDMAS) is preferred as a precursor.

U.S. Pat. No. 6,153,261 discloses a method for increasing the deposition rate in the formation of silicon oxide, silicon nitride and silicon oxynitride films which comprises using bistertiarybutylaminosilane (BTBAS) as a precursor reactant.

U.S. Pat. No. 6,974,780 discloses a process for depositing $SiO_2$ films on a substrate using a CVD reactor. Silicon precursors, viz, TEOS, diethylsilane, tetramethylcyclo-tetraoxysilioxane, fluorotriethoxysilane and fluorotrialkoxysilane in combination with water and hydrogen peroxide are used as reactants.

BRIEF SUMMARY OF THE INVENTION

The present invention is directed to a method for depositing a silicon oxide layer on a substrate. In a basic process for forming a silicon oxide layer onto a substrate a silane precursor is reacted with an oxidizing agent in a deposition chamber under conditions for generating a silicon oxide layer on the substrate. In the process described herein an organoaminosilane is employed as the silane precursor.

The classes of compounds employed as the precursor are generally represented by the formulas:

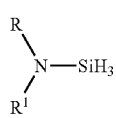

A

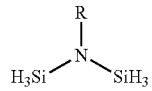

B

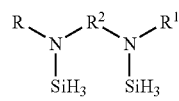

C and mixtures thereof, wherein R is selected from $C_2$-$C_{10}$ alkyl groups, linear, branched, or cyclic, saturated or unsaturated, aromatic, alkylamino groups; R and $R^1$ in Formula A and Formula C is selected from $C_2$-$C_{10}$ alkyl groups, linear, branched, or cyclic, saturated or unsaturated; aromatic, heterocyclic, hydrogen, silyl groups with or without substituents with R and $R^1$ in formula A also being combinable into a cyclic group $(CH_2)_n$, wherein n is from 2-6, preferably 4 and 5 and $R^2$ representing a single bond, $(CH_2)_m$ chain wherein m is from 1-6, a ring, $SiR_2$, or $SiH_2$. Preferred compounds are such that both R and $R^1$ have at least 2 carbon atoms.

The precursors employed in CVD processes can provide for many advantages, and these include:

an ability to facilitate formation of dielectric films at low thermal conditions;

an ability to produce films having low acid etch rates;

an ability to tune the carbon content in the resulting silicon oxide film via changing the ratio of the precursor to oxygen-containing source;

an ability to tune the nitrogen content in the resulting silicon oxide film via changing the ratio of the precursor to nitrogen-containing source;

an ability to form silicon oxide films at good deposition rates; and, an ability to overcome many manufacturing problems commonly caused by the use of various silane precursors due to excessive decomposition rate.

DETAILED DESCRIPTION OF THE INVENTION

The formation of silicon oxide films on semiconductor substrates via chemical vapor deposition (CVD), and plasma enhanced chemical vapor deposition (PECVD), is well known and the deposition processes employed can be used in the practice of this invention. In these processes a reactor chamber is evacuated and a semiconductor substrate placed therein. Then, an organosilicon compound and an oxidizing source are provided to the reactor chamber under conditions wherein a silicon oxide layer is formed on the semiconductor wafer. These films also may be adjusted for carbon, nitrogen and hydrogen content (sometimes referred to as doping) during the process by the addition of carbon, hydrogen and nitrogen sources. The resulting films produced by the use of the organoaminosilane precursors are often referred to as silicon oxide, silicon oxocarbide, silicon oxonitride and silicon carbooxynitride films.

One class of silicon compound suited for the practice of this invention is an organoaminosilane precursor and it is represented by formula A as follows:

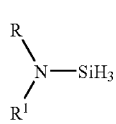

A

In this class of compounds R and $R^1$ are selected from the group consisting of $C_2$-$C_{10}$ alkyl groups, linear, branched, or cyclic, saturated or unsaturated, aromatic, alkylamino groups, heterocyclic, hydrogen, silyl groups, with or without substituents, and R and $R^1$ also being combinable into a cyclic group. Representative substituents are alkyl groups and particularly the $C_{2-4}$ alkyl groups, such as ethyl, propyl and butyl, including their isomeric forms, cyclic groups such as cyclopropyl, cyclopentyl, and cyclohexyl. Illustrative of some of the preferred compounds within this class are represented by the formulas:

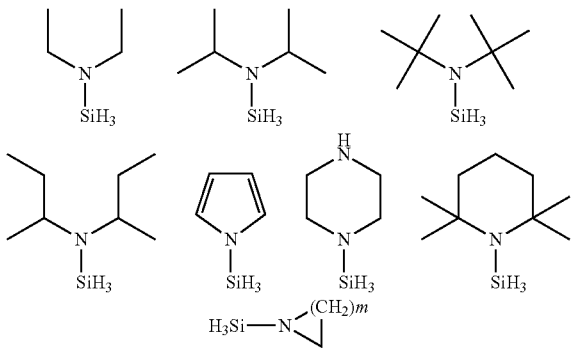

where m is 1-6, preferably 4 or 5.

The second class of organoaminosilane precursor suited for use in producing silicon oxide layers is an organoaminosilane which has two silyl groups pendant from a single nitrogen atom as represented by formula B.

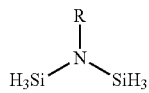

B

As with the R groups of the Class A compounds, R is selected from the group consisting of $C_2$-$C_{10}$ alkyl groups, linear, branched, or cyclic, saturated or unsaturated, aromatic, alkylamino groups, and heterocyclic. Specific R groups include methyl, ethyl, propyl, allyl, butyl, dimethylamine group, and cyclic groups such as cyclopropyl, cyclopentyl, and cyclohexyl. Illustrative compounds are represented by the formulas:

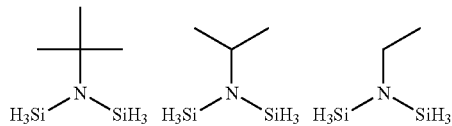

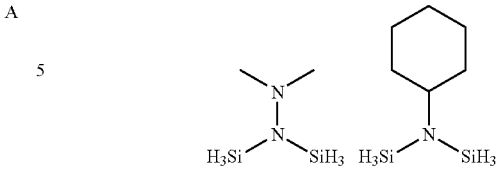

The third class of aminosilane compound is represented by formula C. These are generally diaminodisilyl compounds where R and $R^1$ are same as R and $R^1$ in formula A. The $R^2$ group bridges the nitrogen atoms. Sometimes the $R^2$ group is nothing more than a single bond between the nitrogen atoms or it may be a bridging group, such as $SiR_2$, $SiH_2$, a $(CH_2)_m$ chain wherein m is from 1-6, or a ring. The formula is as follows:

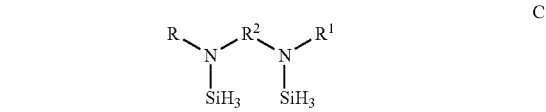

C

Specific examples include those represented by the formulas:

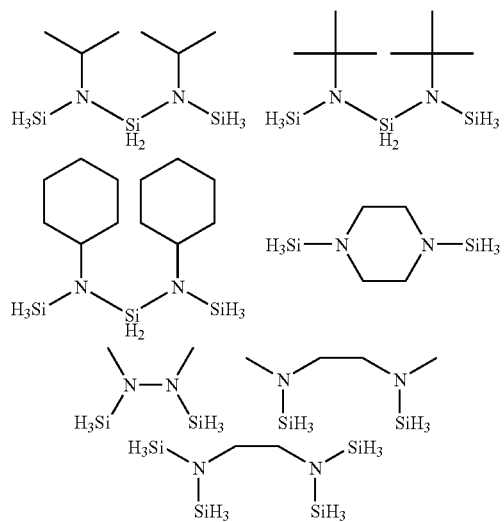

It has been found though that even though the above organoaminosilanes are suitable for producing silicon oxide films on a semiconductor substrate, organoaminosilanes of formula A are preferred. The dialkylaminosilanes meet the criteria of some of the prior silanes as precursors in that they form films having similar dielectric constants. In particular, diisopropylaminosilane offers excellent low etch rates which offers unexpected properties in the process in that it is stable and has a longer shelf life than many of the other silane precursors.

Silicon oxide films may be formed in deposition chambers designed for chemical vapor deposition (CVD), low pressure chemical vapor deposition (LPCVD), plasma enhanced CVD (PECVD), atomic layer deposition (ALD), and so forth. The term CVD as used herein is intended to include each of these processes which are employed in the semiconductor industry.

Conventional oxidizing agents may be used as the oxygen source for converting the dialkylaminosilane to a silicon oxide film in the deposition chamber. Representative oxidizing agents include hydrogen peroxide, nitrous oxide, ozone, and molecular oxygen. Typically, the oxidizing agent to silane precursor ratio is greater than 0.1, preferably from 0.1 to 6 moles oxidizing agent per mole of organoaminosilane precursor.

Conventional nitrogen sources which may be used in the formation of silicon oxynitride films include ammonia, hydrazine, alkylhydrazine, dialkylhydrazine and mixtures.

The organoaminosilanes of formulas A and B described herein offer the fabricator the ability to form silicon oxide films via CVD at relatively low temperatures, although one can operate over a general temperature range of from 350 to 700° C.

Low pressure chemical vapor deposition processes (LPCVD) involve chemical reactions that are allowed to take place on a variety of substrates, e.g., silicon and aluminum, within a pressure range generally of from 0.1 to 500 torr, preferably from 0.5 to 20 Torr. High pressure CVD may result in gas phase nucleation or predeposition before the desired substrate is reached. Dilution of the silane precursor with inert gases, such as nitrogen and helium, may be required for such high pressure reactions. The use of inert gases by the fabricator to achieve corresponding dilution of the precursor may improve the conformality of the deposition or improve the penetration for chemical vapor infiltration.

By using an isopropylaminosilane, and preferably diisopropylaminosilane as a particular silane precursor, one can form an oxide film which deposits at a rate of 5 Å/min to 60 Å/min with refractive index in the range 1.45 to 1.70, and wet etch rate (in 1% HF solution) in the range 0.01 Å/second to 1.5 Å/second.

The following examples are provided to illustrate various embodiments of the invention and are not intended to restrict the scope thereof.

General Procedure

The precursors were tested in an LPCVD reactor used to qualify experimental precursors for silicon oxide depositions. The precursors were degassed and metered into the reactor through a low-pressure mass flow controller (MFC). The MFC flows were calibrated against weight losses of the chemicals vs. time of flow. Additional reactants, such as oxygen, and diluents, such as nitrogen and helium, were also metered into the reactor through calibrated MFCs. The reactor was connected to a roots blower/dry pump combination capable of evacuating the reactor to below 1 E-4 Torr (0.013 Pa). The temperature across a load of silicon wafers, during deposition, was within 1° C. of the set point.

The wafers were loaded onto a quartz boat and inserted in the reactor. The reactor is pumped to base pressure and checked for leaks. The system was ramped to the process temperature with gas flows that would dilute any residual oxygen or moisture to prevent any oxidation of the silicon wafers as the reactor heats up. The reactor was then stabilized for a predetermined time to bring all wafer surfaces to an equal temperature as had been determined by previous measurements on wafers with attached thermocouples.

The gases and vapors were injected into the reactor for a predetermined deposition time at a controlled pressure. Next, the gases were shut off, and the reactor pumped to a base pressure. The reactor then was pump-purged, pumped down, and pump-purged to clear any reactive gases and vapors as the reactor was cooled down. The reactor was backfilled to atmospheric pressure; the wafers were removed and allowed to cool to room temperature. The deposited films were then measured for film thickness, film refractive index, film stress, infrared absorbances, dielectric constant, and acid etch rate.

EXAMPLE 1

Formation of Silicon Oxide Film Using Diethylaminosilane Precursor

The general procedure outlined above was followed using the following reactants and flow conditions. 11.7 sccm of diethylaminosilane (DEAS) was flowed into the LPCVD reactor at 500° C. with 5.9 sccm $O_2$ at 0.6 Torr for a deposition time of 74 minutes.

The average film thickness of the silicon oxide film was 123 nm and refractive index was 1.459. The wet etch rate of this film in 1% HF solution was 1.38 Å/second. The infrared spectra were dominated by Si—O—Si absorptions. C—H absorptions were in the noise, indicating the film was silicon dioxide. Film composition analysis by Rutherford backscattering spectroscopy (hydrogen by forward scattering) indicated that this film was 28 atom percent silicon, 57 atom percent oxygen, 11 atom percent hydrogen, 3 atom percent carbon, and 1 atom percent nitrogen, indicating that the film was silicon dioxide with hydrogen, carbon, and nitrogen impurities.

EXAMPLE 2

Formation of Silicon Oxide Film Using Diethylaminosilane Precursor

The procedure of Example 1 was followed with the exception of process conditions. The purpose was to determine the effect of a higher temperature and reduced reaction time. In this example, 11.7 sccm of diethylaminosilane (DEAS) was flowed into a reactor at 600° C. with 5.9 sccm $O_2$ at 0.6 Torr for a deposition time of 33 minutes.

The average film thickness of the silicon oxide film was 157 nm and the refractive index was 1.501. The wet etch rate of this film in 1% HF solution was 0.41 Å/second. The infrared spectra were dominated by Si—O—Si absorptions. C—H absorptions were in the noise, indicating the film was silicon oxide. Film composition analysis by Rutherford backscattering spectroscopy (hydrogen by forward scattering) indicated that this film was 27 atom percent silicon, 47 atom percent oxygen, 15 atom percent hydrogen, 7 atom percent carbon, and 4 atom percent nitrogen, indicating that the film was silicon dioxide with hydrogen, carbon, and nitrogen impurities.

EXAMPLE 3

Formation of Silicon Oxide Film Using Diisopropylaminosilane Precursor

The procedure of Example 1 was followed essentially with the exception of process conditions and the precursor. In this example, 10.5 sccm of diisopropylaminosilane (DIPAS) was flowed into a reactor at 500° C. with 5.0 sccm $O_2$ at 0.6 Torr for a deposition time of 74 minutes.

The average film thickness of the silicon oxide film was 112 nm and refractive index was 1.458. The wet etch rate of this film in 1% HF solution was 1.39 Å/second. The infrared spectra were dominated by Si—O—Si absorptions. C—H absorptions were in the noise, indicating the film was silicon oxide. Film composition analysis by Rutherford backscattering spectroscopy (hydrogen by forward scattering) indicated that this film was 28 atom percent silicon, 55 atom percent oxygen, 12 atom percent hydrogen, 3 atom percent carbon, and 2 atom percent nitrogen, indicating that the film was silicon dioxide with hydrogen, carbon, and nitrogen impurities.

EXAMPLE 4

Formation of Silicon Oxide Film Using Diisopropylaminosilane Precursor

The procedure of Example 2 was followed with the exception of process conditions and the precursor. In this example, 10.5 sccm of diisopropylaminosilane (DIPAS) was flowed into a reactor at 600° C. with 5.0 sccm $O_2$ at 0.6 Torr for a deposition time of 33 minutes.

The average film thickness of the silicon oxide film was 124 nm and refractive index was 1.495. The wet etch rate of this film in 1% HF solution was 0.42 Å/second. The infrared spectra were dominated by Si—O—Si absorptions. C—H absorptions were in the noise, indicating the film was silicon oxide. Film composition analysis by Rutherford backscattering spectroscopy (hydrogen by forward scattering) indicated that this film was 28 atom percent silicon, 51 atom percent oxygen, 11 atom percent hydrogen, 6 atom percent carbon, and 4 atom percent nitrogen, indicating that the film was silicon dioxide with hydrogen, carbon, and nitrogen impurities.

In summary, Examples 1-4 show that an organoaminosilane of the type set forth in formula A may be used as a precursor for producing silicon oxide films on a semiconductor substrate. The diisopropylaminosilane, DIPAS, offers advantages to the use of diethylaminosilane (DEAS) as a precursor in a low etch rate oxide process. DEAS is less stable than DIPAS at room temperature. The instability of DEAS can result in many EH&S management, production, supply line (including warehousing and shipping), and end user process challenges. Examples 3 and 4 show the oxide films formed from DIPAS generally have the same etch rates, dielectric constants, refractive index, and qualitative composition (via FTIR) as the oxide films formed from DEAS in Examples 1 and 2 under similar process conditions. Thus, from both chemical and process viewpoints, DIPAS is a preferred precursor for producing low etch rate silicon oxide films.

The invention claimed is:

1. A process for forming a silicon oxide film on a substrate which comprises:

forming the silicon oxide film on the substrate in a chemical vapor deposition process by reaction with an oxidizing agent with a silane precursor selected from the group consisting of an organoaminosilane represented by the formulas:

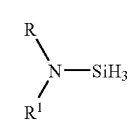

A

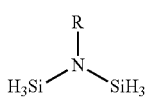

B

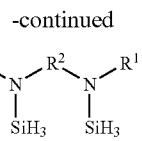

C wherein R and $R^1$ are selected from the group consisting of $C_3$ to $C_{10}$ alkyl groups, branched, or cyclic, saturated or unsaturated, aromatic, heterocyclic, with or without substituents and alkylamino groups; R and $R^1$ in formula A and formula C can also be formed into a cyclic group $(CH_2)_n$, wherein n is from 2-6, and $R^2$ representing a single bond, a $(CH_2)_m$ chain wherein m is from 1-6, a ring, $SiR_2$, or $SiH_2$.

2. The process of claim 1 wherein R and $R^1$ are cyclic.

3. The process of claim 1 wherein R and $R^1$ are combined into a ring in the form of $(CH_2)$ and where n is from 4-5.

4. The process of claim 1 wherein the organoaminosilane is represented by the formula A where R and R1 are isopropyl.

5. The process of claim 1 wherein the organoaminosilane is represented by the formulas:

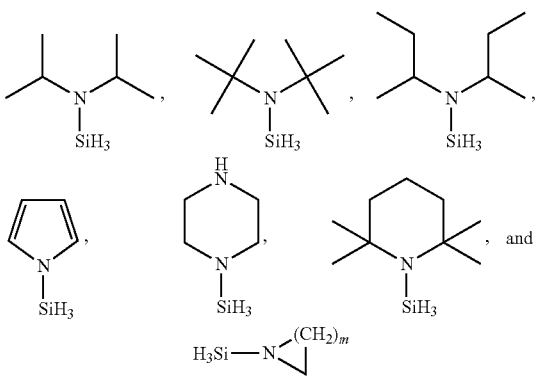

and where m is from 1-6.

6. The process of claim 1 wherein the oxidizing agent is selected from the group consisting of oxygen, hydrogen peroxide, ozone and nitrous oxide.

7. The process of claim 1 wherein the organoaminosilane is represented by the formula B and within that class, the organoaminosilane is selected from the group having the formula:

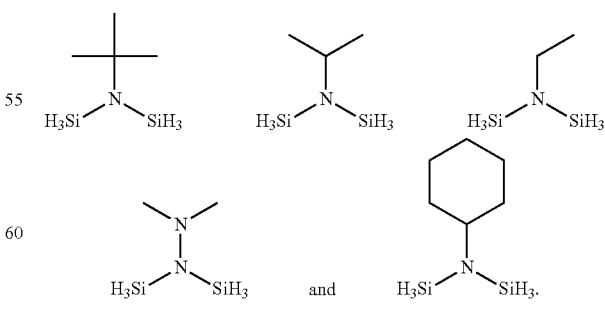

8. The process of claim 7 wherein the oxygen source is selected from the group consisting of oxygen, hydrogen peroxide, ozone and nitrous oxide.

9. The process of claim 8 wherein the organoaminosilane is represented by the formula:

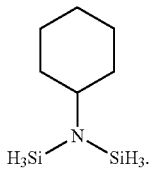

10. The process of claim 1 wherein the organoaminosilane is represented by the formula C and within that class, the organoaminosilane is selected from the group having the formulas:

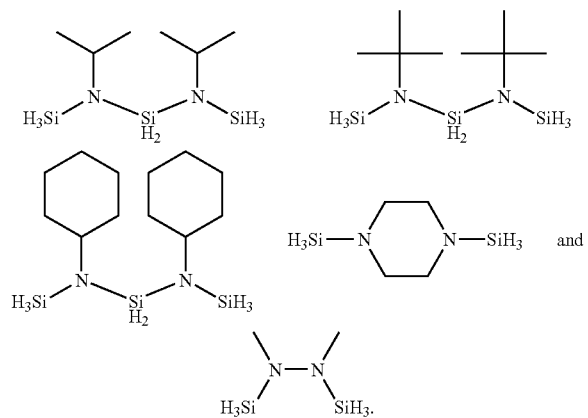

11. The process of claim 1 wherein a carbon and a hydrogen source are incorporated in the deposition chamber for forming a silicon oxide film doped with carbon and hydrogen.

12. The process of claim 11 wherein a nitrogen source is incorporated in the deposition chamber for forming a silicon oxide film doped with carbon, nitrogen, and hydrogen.

13. A process for producing a silicon oxide dielectric layer upon a substrate by chemical vapor deposition in a chemical vapor deposition chamber which comprises:
    introducing diisopropylaminosilane and an oxidizing agent into said chemical vapor deposition chamber under conditions for reacting said diisopropylaminosilane with said oxidizing agent and depositing a silicon oxide layer onto said substrate.

14. The process of claim 13 wherein the oxidizing agent is selected from the group consisting of ozone, oxygen, nitrous oxide and hydrogen peroxide.

15. The process of claim 14 wherein the mole ratio of oxidizing agent to diisopropylaminosilane is from 0.1 to 10 moles oxidizing agent per mole of diisopropylaminosilane.

16. A process for producing a silicon oxynitride dielectric layer upon a substrate by chemical vapor deposition in a chemical vapor deposition chamber which comprises:
    introducing diisopropylaminosilane, a nitrogen source and an oxidizing agent into said chemical vapor deposition chamber under conditions for reacting said diisopropylaminosilane with said oxidizing compound, and said nitrogen source to deposit a silicon oxynitride layer onto said substrate.

17. The process of claim 16 wherein the oxidizing agent is selected from the group consisting of ozone, oxygen, nitric oxide and hydrogen peroxide.

18. The process of claim 16 wherein the nitrogen source is selected from the group consisting of ammonia, hydrazine, alkylhydrazine, dialkylhydrazine and mixture thereof.

19. The process of claim 14 wherein a temperature of from 350 to 700° C. is employed in said chemical vapor deposition chamber.

20. The process of claim 14 wherein a pressure from 0.1 to 500 Torr is employed in said chemical vapor deposition chamber.

21. The process of claim 1 wherein the chemical vapor deposition is atomic layer deposition.

22. The process of claim 14 wherein the chemical vapor deposition is atomic layer deposition.

23. The process of claim 16 wherein the chemical vapor deposition is atomic layer deposition.

24. The process of claim 13 wherein the introducing step further comprises: adding a source selected from carbon, hydrogen, nitrogen, and combination thereof.

* * * * *